US006958275B2

(12) United States Patent
Metzler

(10) Patent No.: US 6,958,275 B2
(45) Date of Patent: Oct. 25, 2005

(54) MOSFET POWER TRANSISTORS AND METHODS

(75) Inventor: Richard A. Metzler, Mission Viejo, CA (US)

(73) Assignee: Integrated Discrete Devices, LLC, Costa Mesa, CA (US)

(*) Notice: Subject to any disclaimer, the term of this patent is extended or adjusted under 35 U.S.C. 154(b) by 350 days.

(21) Appl. No.: 10/385,807

(22) Filed: Mar. 11, 2003

(65) Prior Publication Data

US 2004/0180500 A1 Sep. 16, 2004

(51) Int. Cl.$^7$ .................. H01L 21/00; H01L 21/8242; H01L 21/336; H01L 21/20; H01L 21/4763

(52) U.S. Cl. .................. 438/270; 438/156; 438/242; 438/246; 438/268; 438/386; 438/589; 438/648; 438/702; 438/243; 438/244

(58) Field of Search ............................ 438/270, 156, 438/242–244, 246, 268, 589, 702, 212, 259, 386, 648

(56) References Cited

U.S. PATENT DOCUMENTS

| | | |
|---|---|---|
| 2,444,255 A | 6/1948 | Hewlett |
| 3,295,030 A | 12/1966 | Allison |
| 3,407,343 A | 10/1968 | Fang |
| 3,427,708 A | 2/1969 | Hans-Jurgen Schutze et al. |
| 3,458,798 A | 7/1969 | Fang et al. |
| 3,566,215 A | 2/1971 | Heywang |
| 3,586,925 A | 6/1971 | Collard |
| 3,617,824 A | 11/1971 | Shinoda et al. |
| 3,619,737 A | 11/1971 | Chiu |
| 3,749,987 A | 7/1973 | Anantha |
| 3,769,109 A | 10/1973 | MacRae et al. |
| 3,864,819 A | 2/1975 | Ying |
| 3,935,586 A | 1/1976 | Landheer et al. |
| 3,943,547 A | 3/1976 | Nagano et al. |
| 3,988,765 A | 10/1976 | Pikor |
| 4,019,248 A | 4/1977 | Black |
| 4,045,250 A | 8/1977 | Dingwall |
| 4,099,260 A | 7/1978 | Lynes et al. |
| 4,104,086 A | 8/1978 | Bondur et al. |
| 4,138,280 A | 2/1979 | Rodov |

(Continued)

FOREIGN PATENT DOCUMENTS

| | | |
|---|---|---|
| DE | 32 19 888 A1 | 12/1983 |
| DE | 196 05 633 A1 | 12/1996 |

(Continued)

OTHER PUBLICATIONS

Yoshino, Hideo et al., "A 70–V, 90–momega mm2, High-Speed Double–Layer Gate UMOSFET Realized by Selective CVD Tungsten", Proceedings of the International Symposium on Power Semiconductor Devices (ISPSD), Davos, Switzerland, May 31–Jun. 2, 1994, New York, IEEE, vol. Symp. 6, May 31, 1994, pp. 365–369.

(Continued)

Primary Examiner—Michael Lebentritt
Assistant Examiner—Ron Pompey
(74) Attorney, Agent, or Firm—Blakely, Sokoloff, Taylor & Zafman LLP

(57) ABSTRACT

Trench MOSFETs and self aligned processes for fabricating trench MOSFETs. These processes produce a higher density of trenches per unit area than can be obtained using prior art masking techniques. The invention self aligns all processing steps (implants, etches, depositions, etc.) to a single mask, thus reducing the pitch of the trenches by the added distances required for multiple masking photolithographic tolerances. The invention also places the source regions and contacts within the side walls of the trenches, thus eliminating the lateral dimensions required, for masking and source depositions or implants from the top surface, from the pitch of the trenches. Various embodiments are disclosed.

29 Claims, 4 Drawing Sheets

U.S. PATENT DOCUMENTS

| | | |
|---|---|---|
| 4,139,880 A | 2/1979 | Ulmer et al. |
| 4,139,935 A | 2/1979 | Bertin et al. |
| 4,140,560 A | 2/1979 | Rodov |
| 4,153,904 A | 5/1979 | Tasch, Jr. et al. |
| 4,246,502 A | 1/1981 | Kubinec |
| 4,318,751 A | 3/1982 | Horng |
| 4,330,384 A | 5/1982 | Okudaira et al. |
| 4,340,900 A | 7/1982 | Goronkin |
| 4,372,034 A | 2/1983 | Bohr |
| 4,403,396 A | 9/1983 | Stein |
| 4,423,456 A | 12/1983 | Zaidenweber |
| 4,508,579 A | 4/1985 | Goth et al. |
| 4,533,988 A | 8/1985 | Daly et al. |
| 4,534,826 A | 8/1985 | Goth et al. |
| 4,579,626 A | 4/1986 | Wallace |
| 4,586,075 A | 4/1986 | Schwenk et al. |
| 4,638,551 A | 1/1987 | Einthoven |
| 4,666,556 A | 5/1987 | Fulton et al. |
| 4,672,736 A | 6/1987 | Westermeier |
| 4,672,738 A | 6/1987 | Stengl et al. |
| 4,680,601 A | 7/1987 | Mitlehner et al. |
| 4,739,386 A | 4/1988 | Tanizawa |
| 4,742,377 A | 5/1988 | Einthoven |
| 4,745,395 A | 5/1988 | Robinson |
| 4,757,031 A | 7/1988 | Kuhnert et al. |
| 4,774,560 A | 9/1988 | Coe |
| 4,777,580 A | 10/1988 | Bingham |
| 4,808,542 A | 2/1989 | Reichert et al. |
| 4,811,065 A | 3/1989 | Cogan |
| 4,822,757 A | 4/1989 | Sadamori |
| 4,857,985 A | 8/1989 | Miller |
| 4,875,151 A | 10/1989 | Ellsworth et al. |
| 4,900,692 A | 2/1990 | Robinson |
| 4,903,189 A | 2/1990 | Ngo et al. |
| 4,927,772 A | 5/1990 | Arthur et al. |
| 4,974,050 A | 11/1990 | Fuchs |
| 5,038,266 A | 8/1991 | Callen et al. |
| 5,047,355 A | 9/1991 | Huber et al. |
| 5,081,509 A | 1/1992 | Kozaka et al. |
| 5,093,693 A | 3/1992 | Abbas et al. |
| 5,101,254 A | 3/1992 | Hamana |
| 5,109,256 A | 4/1992 | De Long |
| 5,132,749 A | 7/1992 | Nishibayashi et al. |
| 5,144,547 A | 9/1992 | Masamoto |
| 5,168,331 A | 12/1992 | Yilmaz |
| 5,184,198 A | 2/1993 | Bartur |
| 5,225,376 A | 7/1993 | Feaver et al. |
| 5,258,640 A | 11/1993 | Hsieh et al. |
| 5,268,833 A | 12/1993 | Axer |
| 5,270,239 A * | 12/1993 | Min et al. .................... 438/253 |
| 5,296,406 A | 3/1994 | Readdie et al. |
| 5,298,780 A * | 3/1994 | Harada ....................... 257/330 |
| 5,340,757 A | 8/1994 | Chantre et al. |
| 5,349,224 A * | 9/1994 | Gilbert et al. ............... 257/333 |
| 5,349,230 A | 9/1994 | Shigekane |
| 5,357,131 A | 10/1994 | Sunami et al. |
| 5,365,102 A | 11/1994 | Mehrotra et al. |
| 5,396,087 A | 3/1995 | Baliga |
| 5,426,325 A | 6/1995 | Chang et al. |
| 5,430,323 A | 7/1995 | Yamazaki et al. |
| 5,469,103 A | 11/1995 | Shigekane |
| 5,475,245 A | 12/1995 | Kudo et al. |
| 5,475,252 A | 12/1995 | Merrill et al. |
| 5,479,626 A | 12/1995 | Bindloss et al. |
| 5,506,421 A | 4/1996 | Palmour |
| 5,510,641 A | 4/1996 | Yee et al. |
| 5,536,676 A | 7/1996 | Cheng et al. |
| 5,780,324 A | 7/1998 | Tokura et al. |
| 5,818,084 A | 10/1998 | Williams et al. |
| 5,825,079 A | 10/1998 | Metzler et al. |
| 5,885,864 A * | 3/1999 | Ma ............................. 438/253 |
| 5,886,383 A | 3/1999 | Kinzer |
| 5,907,181 A | 5/1999 | Han et al. |
| 6,002,574 A | 12/1999 | Metzler et al. |
| 6,083,846 A | 7/2000 | Fulford, Jr. et al. |
| 6,186,408 B1 | 2/2001 | Rodov et al. |
| 6,396,090 B1 | 5/2002 | Hsu et al. |
| 6,420,757 B1 | 7/2002 | Metzler |
| 6,433,370 B1 | 8/2002 | Metzler |
| 6,737,323 B2 * | 5/2004 | Mo ............................. 438/270 |
| 2003/0003637 A1 | 1/2003 | Ninomiya |

FOREIGN PATENT DOCUMENTS

| | | | |
|---|---|---|---|
| DE | 10231202 A1 * | 2/2004 | ......... H01L/27/115 |
| EP | 0 720 235 A2 | 7/1996 | |
| EP | 0 795 911 A2 | 9/1997 | |
| EP | 1085577 A2 * | 3/2001 | ........... H01L/29/78 |
| EP | 0 193 765 A2 | 4/2002 | |
| JP | 61-156882 | 7/1986 | |
| JP | 63-054762 | 3/1988 | |
| JP | 63-205927 A | 8/1988 | |
| JP | 2-091974 | 3/1990 | |
| JP | 4-162573 | 6/1992 | |
| JP | 5-109883 A | 4/1993 | |
| JP | 08255902 A * | 10/1996 | ........... H01L/29/78 |
| WO | WO - 98/33218 | 7/1998 | |
| WO | WO - 02/27800 A2 | 4/2002 | |

OTHER PUBLICATIONS

Wolf, Stanley et al., "Silicon Processing for the VLSI Era, vol. 1: Process Technology", 1986, Lattice Press, Sunset Beach, California.

Kim, Han–Soo et al., "Breakdown Voltage Enhancement of the p–n Junction by Self–Aligned Double Diffusion Process Through a Tapered $SiO_2$ Implant Mask", IEEE Electron Device Letters, Sep. 1995, vol. 16, No. 9.

Yano, Koji et al., "Application of a Junction Field Effect Transistor Structure to a Low Loss Diode", Jpn. J. Appl. Phys., Mar. 1997, vol. 36, Part 1, No. 3B.

Nam, K.S. et al., "Very high density trench gate power MOSFET using simplified four–mask process", Electronics Letters, Nov. 25, 1999, vol. 35, No. 24.

Narazaki, A. et al., "A 0.35um Trench Gate MOSFET with an ultra low on state resistance and a high destruction immunity during the inductive switching", ISPSD, May 22–25, 2000, Toulouse, France.

Kim, Jongdae et al., "High–Density Low On–Resistance Trench MOSFETs Employing Oxide Spacers and SelfAlign Technique for DC/DC Converter", ISPSD, May 22–25, 2000, Toulouse, France.

Nam, Kee Soo et al., "A Novel Simplified Process for Fabricating a Very High Density P–Channel Trench Gate Power MOSFET", IEEE Electron Device Letters, Jul. 2000, vol. 21, No. 7.

Zeng, Jun et al., "An Ultra Dense Trench–Gated Power MOSFET Technology Using A Self–Aligned Process", Proceedings of 2001 International Symposium on Power Semiconductor Devices & ICs, 2001, Osaka, Japan.

Finney, Adrian et al., "Recessed Trench MOSFET Process Without Critical Alignments Makes Very High Densities Possible", Proceedings of 2001 International Symposium on Power Semiconductor Devices & ICs, 2001, Osaka, Japan.

Peake, Steven T. et al., "Fully Self–Aligned Power Trench-MOSFET Utilising 1um Pitch and 0.2um Trench Width", IEEE, 2002.

Heuting, R.J.E. et al., "Switching Performance of Low–Voltage N–Channel Trench MOSFETs", IEEE, 2002.

Fujishima, Naoto et al., "A High–Density Low On–Resistance Trench Lateral Power MOSFET With a Trench Bottom Source Contact", IEEE Transactions on Electron Devices, Aug. 2002, pp. 1462–1468, vol. 49, No. 8.

* cited by examiner

MOSFET POWER TRANSISTORS AND METHODS

BACKGROUND OF THE INVENTION

1. Field of the Invention

The present invention generally relates to MOSFET power transistors and processes for manufacturing MOSFET power transistors.

2. Prior Art

MOSFET transistors have certain characteristics which can be advantageously applied to power applications such as in power supplies, power amplifiers and the like. In particular, a MOS transistor acts as variable resistance device, and when turned on, has a relatively low resistance inversely dependent on the width of the channel of the MOSFET transistor. Consequently for power devices, the on resistance can be reduced as desired by merely increasing the channel width, though of course this also increases the semiconductor die size required for the transistor. MOSFET devices are also easily controlled, can be fabricated with relatively high breakdown voltages as required, and do not require an on current such as the base current of a junction transistor.

Further, MOSFETs are not subject to any current concentrating phenomenon, allowing the fabrication and use of MOSFET devices having a very wide channel region and/or the operation of multiple identical MOSFET transistors connected in parallel without special protection against current hogging. This is in comparison to a pn junction type device wherein the forward conduction voltage drop across the pn junction decreases with increasing temperature. Thus for a large area, high current device, the temperature across the junction may not be perfectly uniform. Accordingly, any higher temperature region will have a lower forward conduction voltage drop, resulting in the hogging of current from other areas of the pn junction in a rapidly escalating manner until there is a local overheating and failure of the junction. Thus unless special protections are provided, large area pn junctions will fail at current densities way below current densities tolerated by small area pn junctions.

Also various semiconductor packaging techniques for increasing the allowable power dissipation of semiconductor devices are known. However, for any particular packaging technique or design, there will be a limit on the power that may be dissipated in the semiconductor device without adverse affects on the semiconductor device. This limit usually is dependent on power or average power dissipated per unit area of the semiconductor device. For a power MOSFET, the current per unit of substrate area can be increased if the on resistance of the MOSFET transistor or transistors occupying that area can be reduced.

In a conventional MOS structure, source and drain regions are formed in the substrate with a channel region having an insulated gate thereover between the source and drain. Such structures are generally used in integrated circuits, though as power devices require a relatively large substrate area. Also known, however, are trench FETs. These devices are formed by etching trenches in a silicon substrate and effectively forming MOSFETs on the sides of the trenches. Such structures have the advantage of providing a greater channel width per unit of substrate area than the more conventional planar structure, thereby having substantial advantages thereover. The present invention provides a new MOSFET structure and method of fabrication, providing even substantially greater channel widths per unit of substrate area, thereby providing MOSFET structures having a lower on resistance, and thus a higher current carrying capacity per unit area than even prior art trench FETs.

BRIEF SUMMARY OF THE INVENTION

Trench MOSFETs and self aligned processes for fabricating trench MOSFETs are disclosed. These processes produce a higher density of trenches per unit area than can be obtained using prior art masking techniques. The invention self aligns all processing steps (implants, etches, depositions, etc.) to a single mask, thus reducing the pitch of the trenches by the added distances required for multiple masking photolithographic tolerances.

The invention also places the source regions and contacts within the side walls of the trenches, thus eliminating the lateral dimensions required, for masking and source depositions or implants from the top surface, from the pitch of the trenches.

Other aspects and features of the present invention will become apparent to those ordinarily skilled in the art upon review of the following description of specific embodiments of the invention in conjunction with the accompanying claims and figures.

BRIEF DESCRIPTION OF THE DRAWINGS

The features and advantages of the present invention will become apparent from the following detailed description of the present invention in which.

DETAILED DESCRIPTION OF THE PREFERRED EMBODIMENTS

In manufacturing the MOSFETs of the present invention, the masking and manufacturing techniques described in U.S. patent application Ser. No. 09/689,074 entitled "METHOD AND APPARATUS FOR PATTERNING FINE DIMENSIONS" filed by Richard A. Metzler on Oct. 12, 2000, which is incorporated herein by reference, can also be used to reduce the cost of masking and provide finer lines in the present invention than might otherwise be attainable.

Processes for fabricating exemplary embodiments of the present invention are presented herein in relation to the cross-sectional views of FIGS. 1A through 1P and FIGS. 2A–2N. A MOSFET in accordance with the present invention may typically be thought of as a plurality of very wide channel MOSFET devices (such as may extend over a significant part of, or even most of, a chip dimension or even a die dimension) located in very close proximity to each other and coupled in parallel as a result of the fabrication process itself.

Figure 1A:
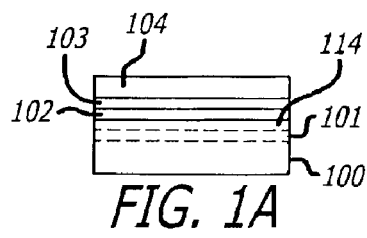
FIGS. 1A through 1P are cross-sectional views illustrating steps in an exemplary process for fabricating the diode connected vertical metal oxide semiconductor field effect devices of the present invention.
Figure 1B:
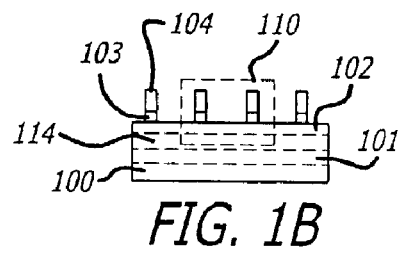
Figure 1C:
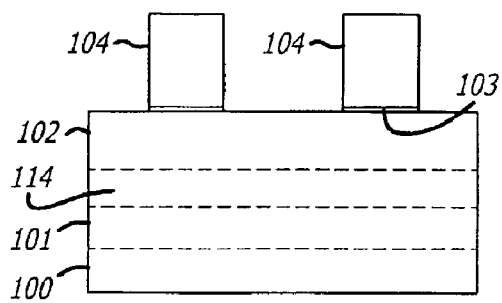
Figure 1D:
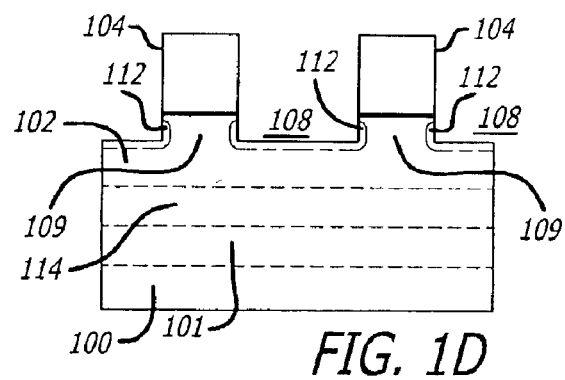
Figure 1E:
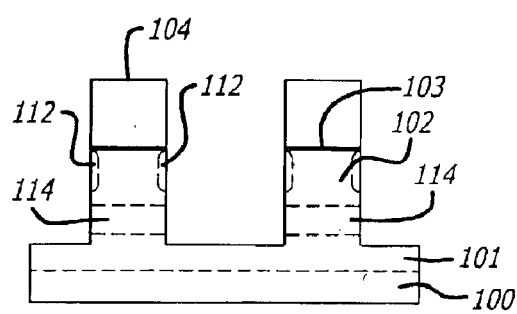
Figure 1F:
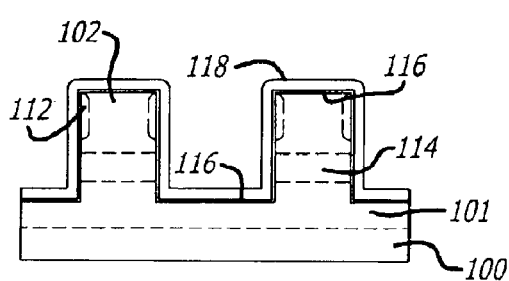
Figure 1G:
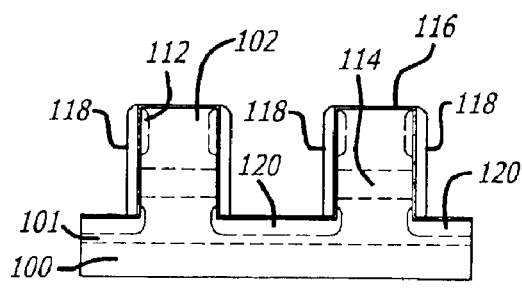
Figure 1H:
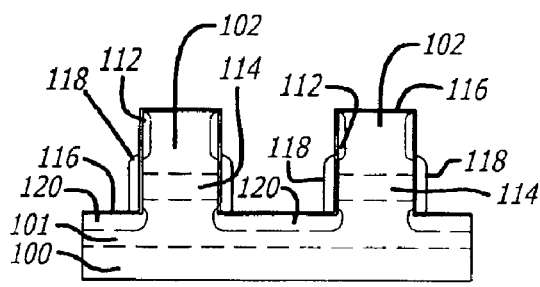
Figure 1I:
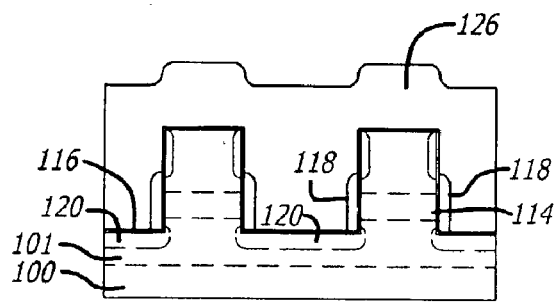
Figure 1J:
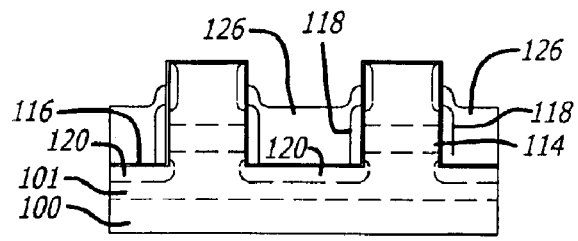
Figure 1K:
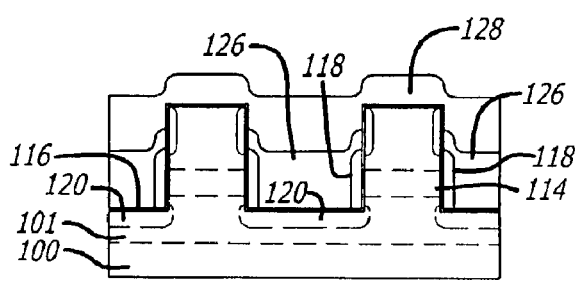
Figure 1L:
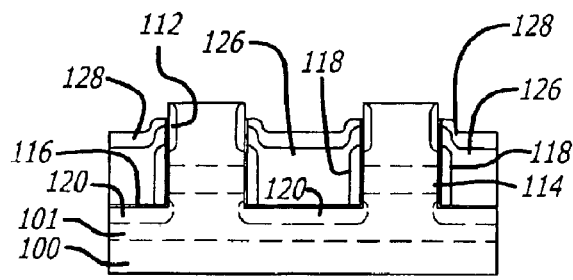
Figure 1M:
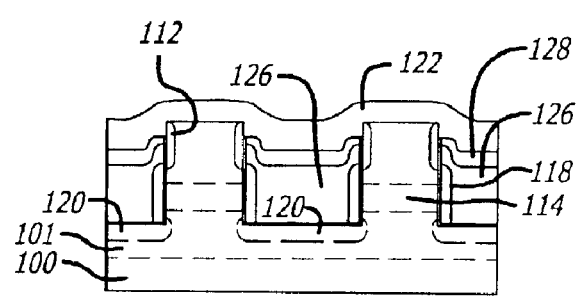
Figure 1N:
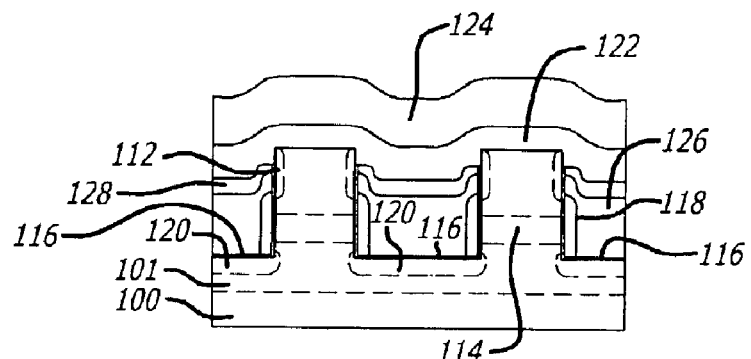
Figure 1O:
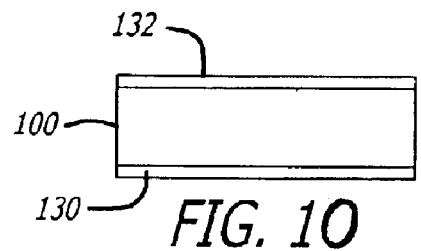
Figure 1P:
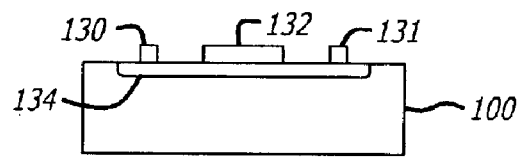

Referring now to FIGS. 1A through 1P, cross-sectional views illustrating steps of an exemplary process for fabricating the metal oxide semiconductor field effect devices (MOSFETs) of the present invention are illustrated. The MOSFETs are preferably (but not necessarily) formed using linear pedestals, such as may extend over a significant part of a chip or die dimension, or even over most or essentially all of the associated die dimension. In that regard, FIGS. 1A through IN show cross sections of only a portion of a wafer illustrating the formation of a limited number of commonly connected MOSFET devices. Typically, additional commonly connected devices are simultaneously formed by simultaneous replication of the commonly connected devices across larger portions or each entire die on the semiconductor wafer. Also typically each commonly connected group of multiple devices will incorporate some form of edge termination to provide the breakdown voltage as needed, as is well known in the art.

In the Figures to follow, for purposes of clarity, relative dimensions are not necessarily accurately depicted. Further, while the various layers are generally identified by their respective identification numerals, again for purposes of clarity, each and every Figure is not necessarily to the same scale.

For the starting point in the preferred process, a commercially available substrate 100 (n-type preferably) having an epitaxial layer 101 of the same conductivity type thereon. This layer is used to form an increased reverse bias breakdown voltage for the MOSFET devices. Then a sheet implant is used to provide a further n-type layer 114 that ultimately will become the drain regions for the MOSFETs. This layer may be formed using an Arsenic implant with a dose of about 3e14 at about 15 KeV. This is followed by the growth of layer 102 of the opposite conductivity type directly on top of the layer 114, forming a pn junction therebetween. In one embodiment with an N-type substrate, the N-type silicon epitaxial layer 101 has a resistivity of approximately 1.1 ohm-cm and a thickness of approximately 3 $\mu$m in order to achieve a reverse bias breakdown voltage of about forty-five volts. The second P-type layer 102 has a resistivity of 0.25 ohm-cm, 0.6 $\mu$m thick that is selected to determine the MOSFET threshold.

In the case of an N-type silicon substrate, the lower or backside surface of the substrate 100 may form the drain while a portion of the top surface (layer 114) of the substrate 100 may form the source. In the case of a P-type silicon substrate, preferably the source and drain terminals are not reversed, and the lower or backside surface of the substrate 100 may again form the drain while a portion of the top surface (layer 114 again) of the substrate 100 may form the source, though of course the doping and implants that one might use change in the later case.

A thin oxide layer 103 is grown on the surface of the layer 102 as shown in FIG. 1A to randomize the sheet implant which is to follow. The thin oxide 103 is typically three hundred Angstroms (300 Å) in thickness. The sheet implant that follows requires no masking by a mask, but rather is composed of ions that are implanted over the entire wafer. The sheet implant is to provide a good ohmic contact for the P-type back gate region of the MOSFETs. The implant is a Boron implant at about $4 \times 10^{15}$ atoms per cm$^2$ with an energy of 15 KeV. Then a layer of oxide 104 is applied on top of the thin oxide 103 across the wafer.

Referring to FIG. 1B, completion of a first masking and etching step is illustrated. The oxide layer 104 is patterned using a mask and areas are etched away, including parts of the thin oxide 103, to leave linear construction pedestals 104 on top of the thin oxide 103. In one embodiment, the construction pedestals 104 are approximately 0.5 micron ($\mu$m) high.

FIG. 1B illustrates a cross-section of four of a plurality of linear pedestals 104 that are formed across the silicon wafer. The dimensions of the rectangular cylindrical construction pedestals 104 in one embodiment are approximately 0.4 microns in width, approximately 1.0 micron in height, with a pitch of approximately 2.0 microns. It is understood that these dimensions can be altered in coordination with any adjustment in the implantation levels in order to provide similar device physics for the MOSFETs. Region 110 of the wafer is shown on an expanded scale in FIG. 1C, with the subsequent Figures showing details of the processing for and around adjacent pedestals 104.

Referring now to FIG. 1D, a portion of the substrate 100 between pedestals 104 has been etched away to a depth of about 1500 Å, forming shallow silicon trenches 108 and substrate pedestals 109 in layer 102. This etch step may be a Reactive Ion Etch (RIE, a directional etch) commonly used in silicon processing to form trench metal-oxide-semiconductor (MOS) transistors and capacitors. An N-type anode contact implant is now performed, typically using Arsenic, with a dose of about 3E15 and an energy of about 15 KeV. This provides regions 112 around the periphery of each pedestal that will become the source of the device.

Referring now to FIG. 1E, additional silicon directional etching has been performed to a depth of 0.6 $\mu$m. Preferably this etch extends entirely through layer 114 between pedestals for improved breakdown, but alternatively may stop within layer 114.

This leaves a source region 112 at the top of the silicon pedestal structure, and drain region 114 near the bottom of the pedestal in contact with the N-type epitaxial layer 101 if used (as shown), or to the N-type substrate if an N-type epitaxial layer is not used. (Use of region 114 is not mandatory, but may be useful however to lower the on resistance of the devices.) If desired, a threshold adjustment implant may now be performed, if desired.

As presented in FIG. 1F, the remaining part of the oxide pedestals 104 is stripped away, and a layer of gate oxide 116, 100 Å thick, and a layer of heavily doped poly silicon 118 are conformally deposited on the device in the first stage of the gate formation. (Alternatively, a metal layer may be deposited and processed much like the poly silicon layer to ultimately form metal gates for the FETs.)

The next process is the RIE etching (a directional etch) of the poly silicon layer, stopping on the oxide layer, to leave sidewall gate regions 118 shown in FIG. 1G. This is followed by a Boron implant that forms a P-type region 120 to block the potential from the bottom of the gate oxide when the MOSFET is off.

A further poly silicon RIE etch is performed as shown in FIG. 1H. This moves the top of the poly gates 118 down to allow access to the source regions 112. This is followed by the deposition of a gate interconnect material 126 as shown in FIG. 1I. This layer can be poly silicon, a silicide (such as tungsten silicide), a barrier metallization (such as Titanium Nitride), or a metal (such as copper). This layer is to provide a low resistance path to all of the gate regions, which will be accessed at an external bond pad region. The pedestal spacing (less than twice the deposited thickness) is such that the region between the pedestals is completely filled. A CMP process may now be performed to planarize the interconnect material surface, if desired.

FIG. 1J shows the results of a subsequent reactive ion etch to remove the excess interconnect material 126, and to countersink the interconnect material surface into the region between pedestals. The interconnect material completely covers the gates 118, but is isolated from the source region by the gate oxide layer 116. Then a gate isolation layer 128 is deposited in a fashion to again fill the trench spacing, as shown in FIG. 1K. This layer is an insulating layer such as SiO2. A reactive ion etch is again applied to remove the excess deposited oxide as shown in FIG. 1L. This etch also removes the residual oxide on top and on the upper side of the exposed pedestal. FIG. 1N shows the finished device with a barrier metal layer 122 (FIG. 1M), and a top metal layer 124 applied over the structure.

Not shown in the foregoing Figures is the drain contact for the MOSFET device, and the manner of bringing out of the source and gate contacts. In some applications, the drain contact is made by depositing a metallization layer 130 on the back of the substrate 100 opposite the vertical MOSFET devices 132, as shown in FIG. 1O. In other applications, the vertical MOSFET devices 132 are formed in a well 134, and the drain contact is made by depositing a metallization layer 130 on the well surface adjacent or surrounding the vertical MOSFET devices, as shown very schematically in FIG. 1P. The gate contact may be made by bring out (exposing) the gate metallization layer in other locations on the chip for connection to a gate lead for the device.

One of the advantages of the foregoing process is that the process is effectively self aligning, in that masking steps are held to a bare minimum, and a very high density MOSFET structure results without any corresponding masking accuracy required. In particular, the initial masking step to define the pedestals 104 of FIG. 1B, being the first masking step, need not be accurately aligned. Thereafter, there may be no masking steps until the FETs are fully fabricated, as shown in FIG. 1N, after which masking may be used to expose the source and gate connections for connection to the outside world. Note however that the mask alignment for any such purposes may be approximate only, and need not be of the scale and accuracy with which the FETs are defined and fabricated by the self aligned process. Alternatively, masking may be used during the FET fabrication process itself to provide for what will ultimately form the gate and source contacts for connection to the outside world. Here again, any such masking need not be of the scale and accuracy with which the FETs are defined and fabricated by the self aligned process.

Further, the foregoing process has the advantage of providing the source contact by way of a metal layer over the FETs. This allows the use of a thick conductive layer for the source contact, minimizing the resistance of this conductor.

Figure 2A:
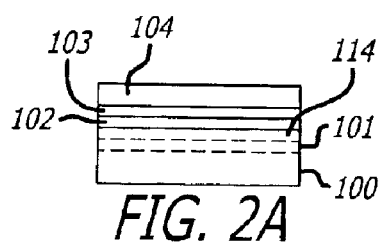
FIGS. 2A through 2H are cross-sectional views illustrating steps in another exemplary process for fabricating the diode connected vertical metal oxide semiconductor field effect devices of the present invention.
Figure 2B:
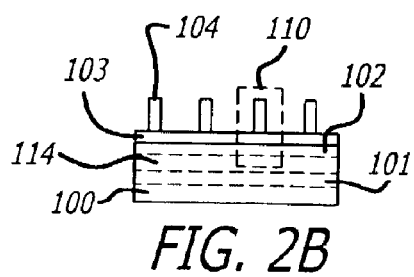
Figure 2C:
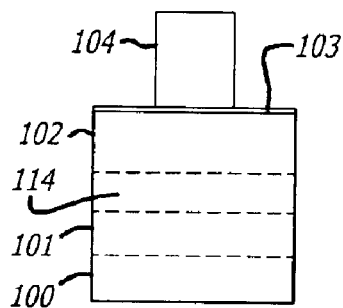
Figure 2D:
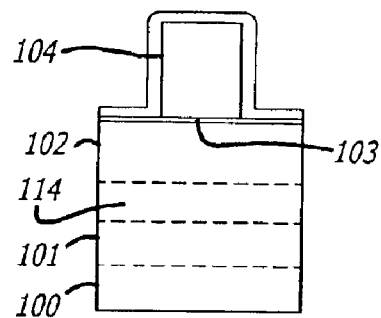

Now referring to FIGS. 2A through 2H, an alternate process for forming the MOSFETs of the present invention may be seen. In this process, the initial steps of FIGS. 2A through 2C are substantially the same as for that described with respect to FIG. 1, specifically FIGS. 1A through 1C. Accordingly, FIGS. 2A through 2C use the same numerical identifications as FIGS. 1A through 1C. However, a nitride layer is provided between the thin oxide layer (103 in the earlier Figures) and the thick oxide layer (104 in the earlier Figures). For purposes of the present Figures, the thin oxide layer 103 of the earlier Figures may be considered to comprise a thin oxide layer with a nitride layer thereon.

Figure 2E:
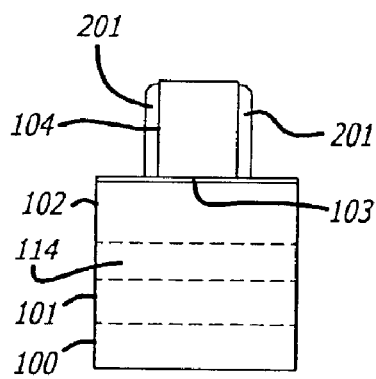
Figure 2F:
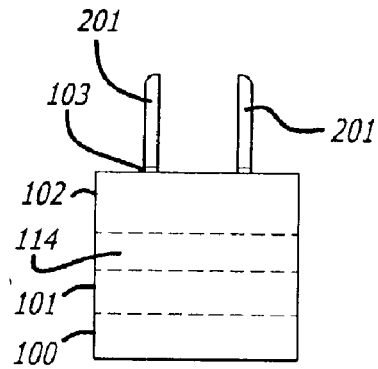
Figure 2G:
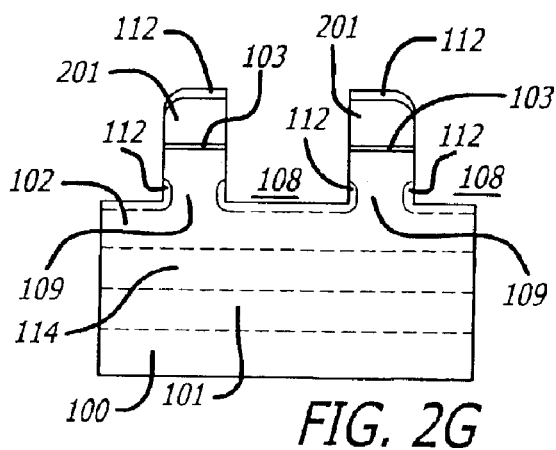
Figure 2H:
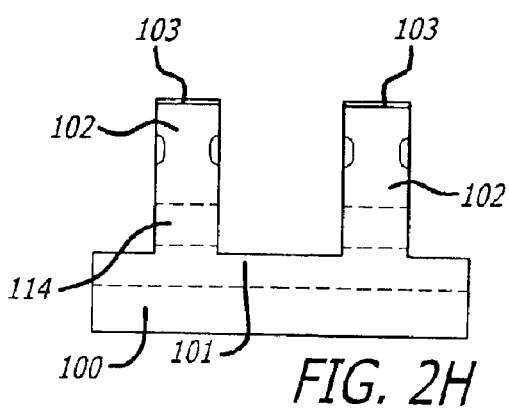

Next, a layer of poly silicon 201 is deposited (FIG. 2D), followed by a directional etch to remove the poly silicon from the horizontal surfaces, leaving the poly silicon sidewalls 201 of FIG. 2E on the oxide pedestals 104. Removal of the oxide pedestals 104 (FIG. 2F) leaves the sidewall regions 201 for use as construction pedestals in place of the oxide construction pedestals 104 of the previous fabrication method. An N-type anode contact implant is now performed, typically using Arsenic, with a dose of about 3E15 and an energy of about 15 KeV. This provides regions 112 around the periphery of each pedestal that will become the source of the device, as in FIG. 1D. It also forms similar regions at the top of the poly silicon construction pedestals 201. Thereafter, a further directional etch is performed, as illustrated in FIG. 2H (like that illustrated in FIG. 1E). This leaves a source region 112 at the top of the silicon pedestal structure, and drain region 114 near the bottom of the pedestal in contact with the N-type epitaxial layer 101 if used (as shown), or to the N-type substrate if an N-type epitaxial layer is not used. (Use of region 114 is not mandatory, but may be useful however to lower the on resistance of the devices.) The etch also removes regions 112 at the top of the construction pedestals, and may remove most if not all of the remaining material of the original construction pedestals, though some vertical thickness of the construction pedestals may remain. Otherwise, processing to completion of the FETs may proceed as before described, resulting in FETs of substantially the same structure as in the previously described embodiment.

This embodiment of the process preserves the advantages of the process being effectively self aligning and of providing the source contact by way of a continuous thick conductive layer over the FETs. It also has the advantage that the sidewalls used for the construction pedestals may be of a smaller scale and more accurately controlled in width than is possible by definition by masking processes. Consequently, this together with the fact that a single oxide construction pedestal of the prior process yields two construction pedestals in this process, yields an even greater density MOSFET by this method, providing an even greater "on" current density per unit area of semiconductor substrate.

In a completed part in accordance with the exemplary fabrication methods such as illustrated in FIG. 1N, region 120, being of the opposite conductivity type from the epitaxial layer 101, will provide electrical isolation of the gate interconnect material 126 from the substrate 100. Consequently, in embodiments having the region 120, the thin oxide 116 need not extend over the substrate between gate regions on adjacent pedestals, or even under the gate, and therefore may be removed from those areas at appropriate stages of the processing if desired. Similarly, in embodiments having the thin oxide 116 extending under the gate regions and over the substrate between gate regions on adjacent pedestals, formation of the regions 120 is optional. The presence of both regions 120 and the thin oxide between gate regions on adjacent pedestals is preferred however, as both help lower the gate capacitance.

Figure 3:
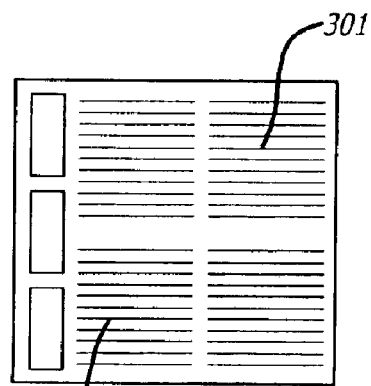
FIG. 3 is a schematic top view of an integrated circuit comprising an array of four interconnected smaller arrays of FETs in accordance with one exemplary embodiment of the present invention.

There has been disclosed herein certain exemplary methods of fabricating diode configured vertical MOSFETs, as well as the MOSFETs so made. It will be noted that in the exemplary processes there is a single masking step having only a trivial alignment requirement with respect to the semiconductor substrate on which the MOSFETs are to be formed. Thereafter, each additional step is self-aligning with respect to the prior step, thereby eliminating multiple masks, and particularly the critical alignment requirement between individual masks of mask sets typically used for the fabrication of semiconductor devices. This simplifies processing, increases yields and reduces wafer to wafer device variations due to differences in mask alignment. Also while not a limitation of the present invention, as stated before, preferably the construction pedestals and thus the resulting NMOSFETs are straight and parallel, as opposed to hollow circular or hexagonal or the like, as arrays 301 of narrow, closely spaced linear FETs in accordance with the present invention, such as schematically shown in FIG. 3, effectively provide very wide channel FETs per unit area of substrate, and allow low resistance interconnection of the gates of each row at the edge of the matrices.

In certain instances in the foregoing description, certain alternate materials and methods were set forth. It is to be noted however, that the identification of specific alternative materials and processes is not to infer that still other materials and processes for those or other steps in the process of fabrication or in the resulting diode devices are excluded from use in the present invention. To the contrary, steps and materials other than those set out herein will be obvious to those skilled in the art. Thus while the present invention has been disclosed and described with respect to certain preferred embodiments, it will be understood to those skilled in the art that the present invention FETs and methods of fabricating the same may be varied without departing from the spirit and scope of the invention.

What is claimed is:

1. A method of forming a power MOSFET comprising:
    (a) providing a layer of a second conductivity type on a first surface of a substrate of a first conductivity type with a pn junction there between;
    (b) forming pedestals in the first surface by masking and directionally etching between pedestals through the layer of the second conductivity type and into the substrate, the pedestals having source regions of the first conductivity type in the sides of the pedestals in the layer of the second conductivity type;
    (c) forming a thin oxide layer on the surfaces of the pedestals and on the substrate between pedestals;
    (d) forming gate regions on the sides of the pedestals spanning the pn junction and a part of the adjacent source regions of the pedestals;
    (e) forming a first interconnect layer in the regions between pedestals in electrical contact with the gate regions and isolated from electrical contact with the source regions, the second conductivity type regions of the pedestals and the substrate by the thin oxide layer;
    (f) forming an electrically insulative layer over the first interconnect layer, the insulative layer leaving a part of the source regions on the pedestals, and the thin oxide layer thereon, exposed;
    (g) removing the thin oxide layer left exposed in (f); and,
    (h) forming a second interconnect layer over the insulative layer and in electrical contact with the source regions left exposed in (g);
    (c) through (h) being performed without masking to form the power MOSFET in accordance with the method claimed.

2. The method of claim 1 further comprised of implanting to form regions of the second conductivity type between the pedestals.

3. The method of claim 1 wherein the pedestals are formed as a plurality of parallel elongate pedestals.

4. The method of claim 1 wherein the first surface of the substrate of the first conductivity type includes an epitaxial layer of the first conductivity type.

5. The method of claim 4 wherein the first surface of the substrate of the first conductivity type includes a sheet implant of the first conductivity type on the epitaxial layer of the first conductivity type.

6. The method of claim 5 wherein the directional etch forming the pedestals extends into the epitaxial layer.

7. The method of claim 5 wherein the directional etch forming the pedestals extends into the sheet implant.

8. The method of claim 1 wherein the source regions in the sides of the pedestals are implant regions.

9. The method of claim 8 wherein the electrically insulative layer is formed to leave a part of the source implant regions exposed, so that the second interconnect layer will make electrical contact with a part of the source implant regions.

10. The method of claim 1 wherein the gate regions are formed as poly silicon gate regions.

11. The method of claim 1 wherein the gate regions are formed by conformally depositing the gate material and performing a directional etch to remove the gate material from horizontal surfaces and to a level below the top of the pedestals.

12. The method of claim 1 wherein the first interconnect layer is formed by depositing a layer selected from the group consisting of poly silicon, a silicide, a barrier metallization, or a metal, and directional etching the first interconnect layer.

13. The method of claim 1 wherein the electrically insulative layer is formed by depositing an $SiO_2$ layer and directionally etching the deposited layer.

14. The method of claim 1 wherein the second interconnect layer is formed by depositing a barrier metal layer and a top metal layer.

15. A method of forming a power MOSFET comprising:
    (a) providing a layer of a second conductivity type on a first surface of a substrate of a first conductivity type with a pn junction therebetween;
    (b) forming pedestals in the first surface by masking and directionally etching between pedestals into the layer of the second conductivity type;
    (c) forming source regions in the sides of the pedestals in the layer of the second conductivity type;
    (d) further forming the pedestals in the first surface by further directionally etching between pedestals through the layer of the second conductivity type and into the substrate;
    (e) forming a thin oxide layer on the surfaces of the pedestals and on the substrate between pedestals;
    (f) forming gate regions on the sides of the pedestals spanning the pn junction and a part of the adjacent source regions on the pedestals;
    (g) forming a first interconnect layer in the regions between pedestals in electrical contact with the gate regions and isolated from electrical contact with the second conductivity type regions of the pedestals, the source regions and the substrate by the thin oxide layer;
    (h) forming an electrically insulative layer over the first interconnect layer, the insulative layer leaving a part of the source regions and the thin oxide layer thereon exposed;
    (i) removing the thin oxide layer left exposed in (h); and,
    (j) forming a second interconnect layer over the insulative layer and in electrical contact with the regions of the pedestals of the second conductivity type left exposed in (i).

16. The method of claim 15 further comprised of implanting to form regions of the second conductivity type between the pedestals.

17. The method of claim 15 wherein the pedestals are formed as a plurality of parallel elongate pedestals.

18. The method of claim 15 wherein the first surface of the substrate of the first conductivity type includes an epitaxial layer of the first conductivity type.

19. The method of claim 18 wherein the first surface of the substrate of the first conductivity type includes a sheet implant of the first conductivity type on the epitaxial layer of the first conductivity type.

20. The method of claim 19 wherein the directional etch forming the pedestals extends into the epitaxial layer.

21. The method of claim 19 wherein the directional etch forming the pedestals extends into the sheet implant.

22. The method of claim 15 wherein the source regions are implant regions.

23. The method of claim 22 wherein the electrically insulative layer is formed to leave a part of the source implant regions exposed, so that the second interconnect layer will make electrical contact with a part of the source implant regions.

24. The method of claim 15 wherein the gate regions are formed as poly silicon gate regions.

25. The method of claim 15 wherein the gate regions are formed by conformally depositing the gate material and performing a direction etch to remove the gate material from horizontal surfaces and to a level below the top of the pedestals.

26. The method of claim 15 wherein the first interconnect layer is formed by depositing a layer selected from the group consisting of poly silicon, a silicide, a barrier metallization, or a metal, and directional etching the first interconnect layer.

27. The method of claim 15 wherein the electrically insulative layer is formed by depositing an $SiO_2$ layer and directionally etching the deposited layer.

28. The method of claim 15 wherein the second interconnect layer is formed by depositing a barrier metal layer and a top metal layer.

29. The method of claim 15 wherein (c) through (j) are performed without masking to form the power MOSFET in accordance with the method claimed.

* * * * *